United States Patent
Nakashima et al.

(10) Patent No.: US 10,202,130 B2
(45) Date of Patent: Feb. 12, 2019

(54) COOLING DEVICE FOR RAILROAD VEHICLE

(71) Applicant: MITSUBISHI ELECTRIC CORPORATION, Chiyoda-ku, Tokyo (JP)

(72) Inventors: Yukio Nakashima, Tokyo (JP); Kota Mikoshiba, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/528,453

(22) PCT Filed: Jan. 8, 2015

(86) PCT No.: PCT/JP2015/050358
§ 371 (c)(1),
(2) Date: May 19, 2017

(87) PCT Pub. No.: WO2016/110977
PCT Pub. Date: Jul. 14, 2016

(65) Prior Publication Data
US 2017/0305443 A1    Oct. 26, 2017

(51) Int. Cl.
*B61D 27/00*    (2006.01)
*B61C 17/00*    (2006.01)
*H05K 7/20*    (2006.01)

(52) U.S. Cl.
CPC .......... *B61D 27/0072* (2013.01); *B61C 17/00* (2013.01); *H05K 7/20863* (2013.01);
(Continued)

(58) Field of Classification Search
CPC .......... H05K 7/20863; H05K 7/20909; H05K 7/20881; H05K 7/20936; B61D 27/0072;
(Continued)

(56) References Cited

U.S. PATENT DOCUMENTS 5,162,974 A * 11/1992 Currie ............... H05K 7/20
                                                    165/185
8,174,833 B2 * 5/2012 Kitanaka ............... B60L 9/16
                                                    361/710
(Continued)

FOREIGN PATENT DOCUMENTS

JP    62-166690 U1    10/1987
JP    04-246229 A      9/1992
(Continued)

OTHER PUBLICATIONS

International Search Report (PCT/ISA/210) dated Apr. 7, 2015, by the Japanese Patent Office as the International Searching Authority for International Application No. PCT/JP2015/050358.
(Continued)

*Primary Examiner* — Mandeep S Buttar
(74) *Attorney, Agent, or Firm* — Buchanan Ingersoll & Rooney PC

(57) ABSTRACT

A cooling device for a railroad vehicle that cools a heat generating body housed in a storage box set on the floor of the railroad vehicle includes a heat conduction plate configuring a part of a side surface of the storage box, the heat generating body being mounted on one surface side of the heat conduction plate, a plurality of heat pipes inclined to project from the other surface side to an upper side of the heat conduction plate, a plurality of fins fixed to the plurality of heat pipes, and a cover that includes opening sections, and covers the cooling device. A total of areas of the opening sections located on the base side of the heat pipes is formed larger than a total of areas of the opening sections located on the distal end portion side of the heat pipes.

8 Claims, 9 Drawing Sheets

(52) U.S. Cl.
CPC ..... *H05K 7/20881* (2013.01); *H05K 7/20909* (2013.01); *H05K 7/20936* (2013.01)

(58) Field of Classification Search
CPC .. B61D 27/00; B61D 27/009; B60H 1/00271; B60H 2001/00221; B60H 1/0021; B60H 2001/003; B60H 2001/00307; B61C 17/04; B61C 11/1874; B61C 2210/30; B61C 2210/40; F01P 1/06
USPC ...................................... 361/679.47; 165/65
See application file for complete search history.

(56) References Cited

U.S. PATENT DOCUMENTS

| | | | |
|---|---|---|---|
| 9,592,739 B2 | 3/2017 | Fujito et al. | |
| 2002/0121811 A1* | 9/2002 | Hashimoto | H02M 7/003 307/11 |
| 2012/0002373 A1* | 1/2012 | Kitajima | F28D 15/0275 361/717 |
| 2013/0002172 A1* | 1/2013 | Toda | B60L 3/003 318/51 |
| 2013/0063067 A1* | 3/2013 | Tanaka | H01L 25/07 318/494 |
| 2014/0290929 A1* | 10/2014 | Opila | H01L 23/427 165/287 |
| 2014/0318736 A1 | 10/2014 | Higashino et al. | |
| 2016/0143193 A1 | 5/2016 | Ono et al. | |

FOREIGN PATENT DOCUMENTS

| | | |
|---|---|---|
| JP | 04-322108 A | 11/1992 |
| JP | 2000-092819 A | 3/2000 |
| JP | 2000-161880 A | 6/2000 |
| JP | 2001-345408 A | 12/2001 |
| JP | 2002-139284 A | 5/2002 |
| JP | 2005-123459 A | 5/2005 |
| JP | 2011-050166 A | 3/2011 |
| JP | 2013-103506 A | 5/2013 |
| JP | 2013-106503 A | 5/2013 |
| JP | 2013-154758 A | 8/2013 |
| JP | 2013-163503 A | 8/2013 |
| JP | 2014-014203 A | 1/2014 |
| JP | 2014-128066 A | 7/2014 |
| JP | 2014-138541 A | 7/2014 |
| WO | WO 2013/084729 A1 | 6/2013 |
| WO | WO 2014/203374 A1 | 12/2014 |

OTHER PUBLICATIONS

Written Opinion (PCT/ISA/237) dated Apr. 7, 2015, by the Japanese Patent Office as the International Searching Authority for International Application No. PCT/JP2015/050358.

Notification of Reasons for Refusal for Japanese Patent Application No. 2016-568223 dated Mar. 21, 2017.

* cited by examiner

| TEMPERATURE IMPROVEMENT RATIO AT TIME WHEN COVER 4a IS SET AS REFERENCE [%] | | |
|---|---|---|
| VEHICLE SPEED | HIGH SPEED | LOW SPEED |
| COVER 4b + FIN A | 1.3 | 1.5 |
| COVER 4c + FIN A | 0.8 | 1.9 |

COOLING DEVICE FOR RAILROAD VEHICLE

FIELD

The present invention relates to a cooling device for a railroad vehicle that cools a heat generating body housed in a storage box set under the floor of the railroad vehicle.

BACKGROUND

A power converting device set under the floor of a railroad vehicle is cooled using natural air cooling during a vehicle stop and using traveling wind during vehicle traveling. Therefore, to perform highly efficient cooling of the power converting device, a structure is necessary that does not prevent an air current of the natural air cooling and can efficiently take in the traveling wind.

For example, Patent Literature 1 discloses a semiconductor cooler of a vehicle control device including a plurality of heat pipes connected to a heat receiving block in which a plurality of power semiconductor elements configuring a power conversion circuit are set and a plurality of heat radiation fins fixed perpendicularly to the plurality of heat pipes. The semiconductor cooling device cools the plurality of heat radiation fins with traveling wind during vehicle traveling to thereby perform cooling of the plurality of semiconductor elements on the heat receiving block. The semiconductor cooling device has a structure provided with a cooling device cover attached with a wind regulating plate formed in a cylindrical shape by closing surfaces other than an inlet and an outlet of cooling wind with the wind regulating plate.

CITATION LIST

Patent Literature

Patent Literature 1: Japanese Patent Application Laid-Open No. 2013-103506

SUMMARY

Technical Problem

However, in Patent Literature 1 described above, an inlet surface for taking in the cooling wind and an outlet surface for discharging the cooling wind are not taken into account. Room for improvement of cooling efficiency is recognized.

The present invention has been devised in view of the above and an object of the present invention is to provide a cooling device for a railroad vehicle that can achieve further improvement of cooling efficiency.

Solution To Problem

To solve the problem and achieve the object, the present invention provides a cooling device for a railroad vehicle that cools a heat generating body housed in a storage box set on the floor of the railroad vehicle, the cooling device including: a heat conduction plate configuring a part of a side surface of the storage box, the heat generating body being mounted on one surface side of the heat conduction plate; a plurality of heat pipes inclined to project from the other surface side to an upper side of the heat conduction plate; a plurality of fins fixed to the plurality of heat pipes; and a protection cover that includes opening sections and covers the cooling device, an area of the opening sections on a side close to the heat conduction plate being formed larger than an area of the opening sections on a side away from the heat conduction plate.

Advantageous Effects of Invention

According to the present invention, there is an effect that it is possible to achieve further improvement of cooling efficiency.

DESCRIPTION OF EMBODIMENTS

Cooling devices for a railroad vehicle (hereinafter abbreviated simply as "cooling device") according to embodiments of the present invention are explained in detail below with reference to the accompanying drawings. Note that the present invention is not limited by the embodiments explained below.

First Embodiment.

Figure 1:
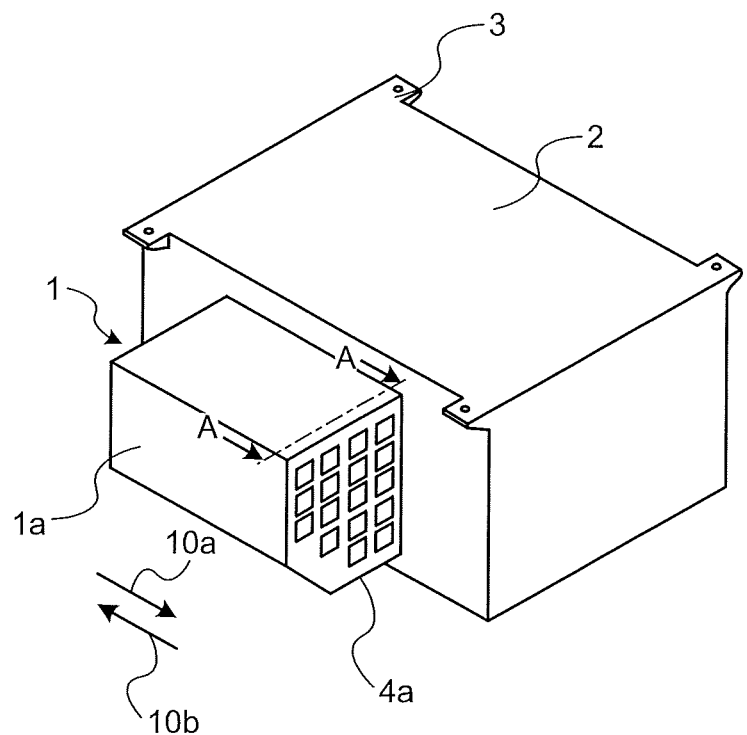
FIG. 1 is a perspective view showing an overview of a cooling device according to a first embodiment.
Figure 2:
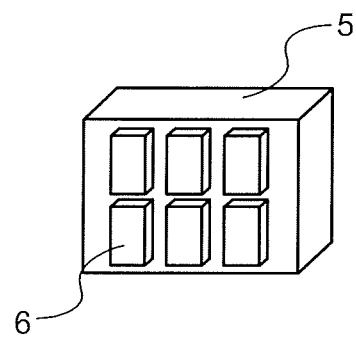
FIG. 2 is a diagram showing an arrangement example of semiconductor modules, which are cooling targets of the cooling device according to the first embodiment.

FIG. 1 is a perspective view showing an overview of a cooling device according to a first embodiment of the present invention. FIG. 2 is a diagram showing an arrangement example of semiconductor modules, which are cooling targets of the cooling device. A cooling device 1 includes a housing 1a having a pentagonal columnar shape and covers 4a, which are protection covers provided at both ends of the housing 1a, covering the cooling device 1, and having air permeability. A side surface of the housing 1a is attached to a side surface of a storage box 2. The storage box 2 attached with the cooling device 1 is set on the floor of a railroad vehicle by a suspension member 3. When the railroad vehicle travels in a direction of a traveling direction 10a or a traveling direction 10b indicated by an arrow, traveling wind is generated. The traveling wind is taken into the housing 1a through the covers 4a. Semiconductor modules 6 are arranged on the inside of the storage box 2 and attached to one surface side of a heat conduction plate 5. The cooling device 1 uses the traveling wind and cooling wind to cool the semiconductor modules 6, which are heat generating bodies.

Figure 3:
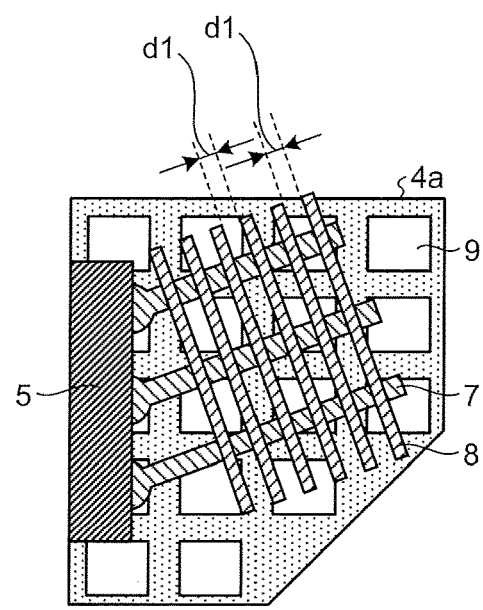
FIG. 3 is a perspective sectional view of a cross section along A-A line in FIG. 1 viewed in a direction of an arrow view.
Figure 4:
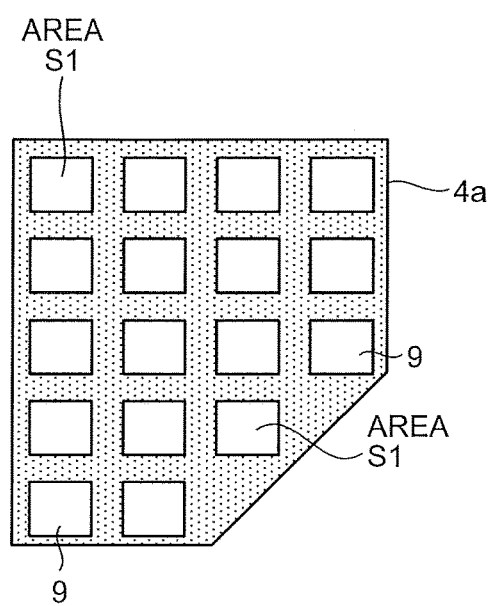
FIG. 4 is a diagram showing a cover shape serving as a reference in explaining a cover shape in the first embodiment.

FIG. 3 is a perspective sectional view of a cross section along A-A line in FIG. 1 viewed in a direction of an arrow view. FIG. 4 is a diagram showing a schematic shape of the cover 4a. Note that the cover 4a shown in FIG. 4 has a cover shape serving as a reference in explaining characteristics of a cover shape of the cooling device according to the first embodiment. In the perspective sectional view shown in FIG. 3, the structure of the inside of the cooling device 1 is shown together with the cover 4a.

The cooling device 1 configures a part of the side surface of the storage box 2 and includes the heat conduction plate 5 to which the heat generating bodies adhere, a plurality of heat pipes 7 inclined and projected from the other surface side to the upper side of the heat conduction plate 5, and a plurality of fins 8 having a rectangular shape and a flat shape fixed to the plurality of heat pipes 7. That is, the heat pipes 7 are arranged in a matrix shape in a state in which, on the other surface side of the heat conduction plate 5 where the semiconductor modules 6 are not attached, the heat pipes 7 have a certain inclination angle on the upper side with respect to the perpendicular on the other surface of the heat conduction plate 5 and project from the other surface of the heat conduction plate 5. The heat conduction plate 5, the heat pipes 7, and the fins 8 configure a cooling member. The fins 8 include pluralities of through-holes. The heat pipes 7 are inserted into the through-holes. In an example shown in FIG. 3, the number of the fins 8 is six. An interval among the fins 8 adjacent to one another is d1. The fins are uniformly arranged with respect to a direction in which the heat pipes 7 extend. Note that, for convenience of explanation, a pattern of the uniformly arranged fins 8 is referred to as "fin A".

In the cover 4a serving as the reference shown in FIG. 4 (hereinafter referred to as "reference cover 4a" according to necessity), seventeen opening sections 9 are provided. The area of the opening sections 9 is S1. The sizes of the opening sections 9 are the same. That is, in the reference cover 4a, the seventeen opening sections 9 each having the same shape and the same area are provided.

Figure 5:
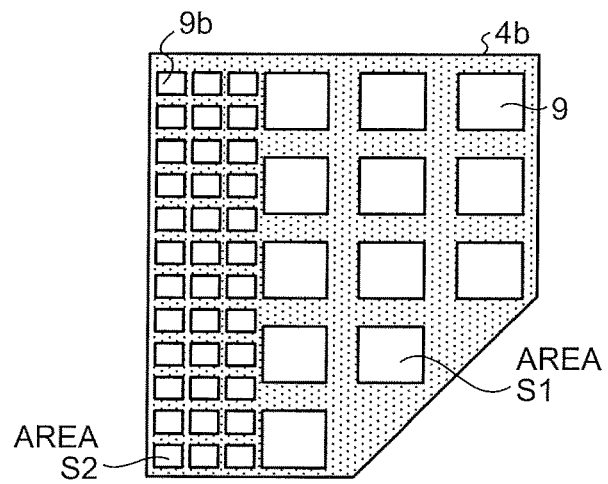
FIG. 5 is a diagram showing a first example of the cover shape according to the first embodiment.
Figure 6:
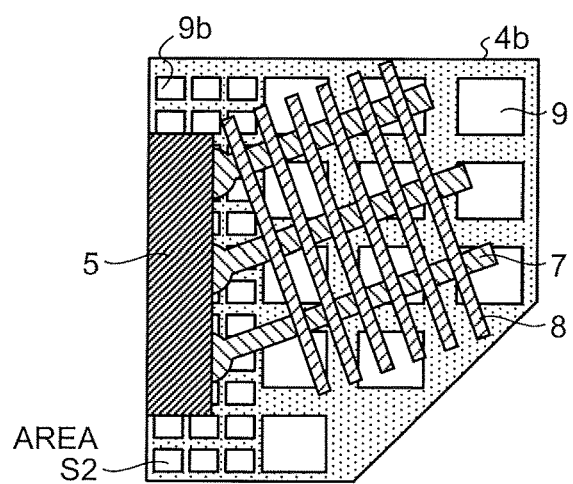
FIG. 6 is a perspective sectional view showing the cover shape according to the first example of the first embodiment together with a cooling member.
Figure 7:
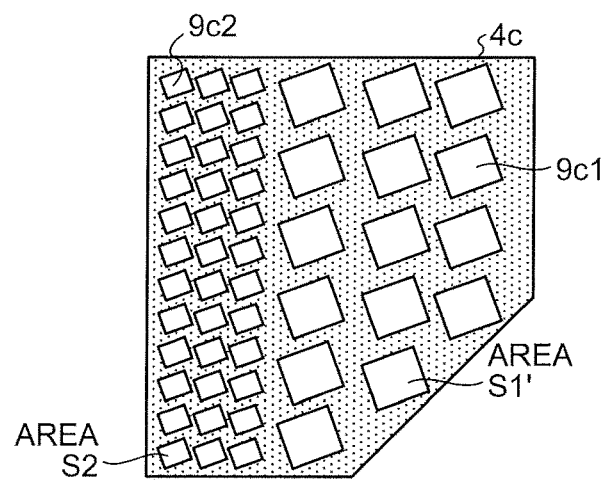
FIG. 7 is a diagram showing a second example of the cover shape according to the first embodiment.
Figure 8:
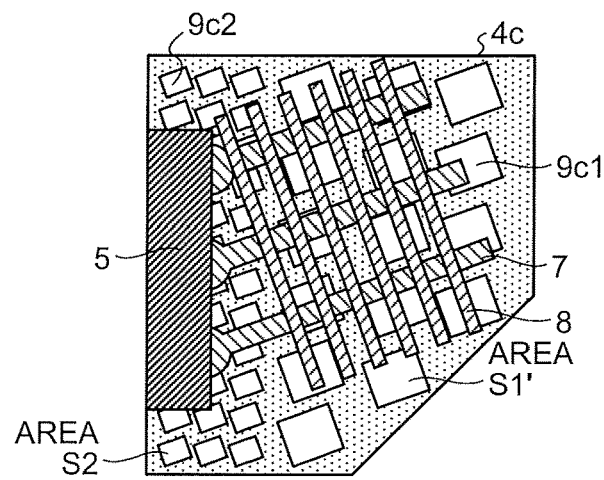
FIG. 8 is a perspective sectional view showing the cover shape according to the second example of the first embodiment together with the cooling member.

Variations of a cover shape according to the first embodiment are explained with reference to the drawings of FIG. 5 to FIG. 8. FIG. 5 is a diagram showing a first example of the cover shape according to the first embodiment. FIG. 6 is a perspective sectional view showing the cover shape according to the first example together with a cooling member. FIG. 7 is a diagram showing a second example of the cover shape according to the first embodiment. FIG. 8 is a perspective sectional view showing the cover shape according to the second example together with the cooling member.

In a cover 4b, which is the first example, opening sections 9b and 9 are arranged with an opening area (hereinafter simply referred to as "area") of the opening sections 9b present around the heat conduction plate 5 set smaller than an area of the other opening sections 9. Explaining in comparison with the reference cover 4a shown in FIG. 4, although five opening sections 9 are provided around the heat conduction plate in FIG. 4, thirty-six opening sections 9b are provided around the heat conduction plate 5 in FIG. 5. When the area of the opening sections 9b in FIG. 5 is represented as S2, there is a relation indicated by the following expression between a total (=36×S2) of areas of the thirty-six opening sections 9b and a total (=5×S1) of the five opening sections 9 in FIG. 4.

$$36 \times S2 > 5 \times S1 \tag{1}$$

Note that, in FIG. 5, the opening sections 9b are arranged in three rows. However the opening sections 9b are not limited to three rows and can be arranged in two rows or can be arranged in four or more rows as long as the relation of the above Expression (1) is satisfied.

In a cover 4c, which is the second example, as shown in FIG. 7 and FIG. 8, as is the case with the arrangement of the opening sections 9 and the opening sections 9b in the first example, the opening sections 9c1 and the opening sections 9c2 are arranged along the direction in which the heat pipes 7 extend. Explaining in comparison with the cover 4b shown in FIG. 5, the number of opening sections (FIG. 5: the opening sections 9b, FIG. 7: opening sections 9c2) provided around the heat conduction plate 5 is the same number of thirty-six in both of FIG. 5 and FIG. 7. Both of a total of areas of the opening sections 9b and a total of areas of the opening sections 9c2 are "36×S2" and equal. On the other hand, the number of opening sections (FIG. 5: the opening sections 9, FIG. 7: opening sections 9c1) provided other than around the heat conduction plate 5, that is, on the distal end portion side of the heat pipes 7 is twelve in FIG. 5 and fifteen in FIG. 7. The numbers of the opening sections are different. The difference is caused because the sectional shape of the covers 4b and 4c is a pentagon and is a shape formed by cutting off a lower right corner of the paper surface. Specifically, in FIG. 7, because the opening sections 9c1 are arranged along the direction in which the heat pipes 7 extends, an area S1' of the opening sections 9c1 is set smaller than the area S1 of the opening sections 9 shown in FIG. 5. Instead, the opening sections are arranged with the number of the opening sections increased. Note that, because the area S1' of the opening sections 9c1 is set smaller than the area S1 of the opening section 9, a relation indicated by the following expression occurs between a total (=12×S1) of areas of the twelve opening sections 9 in FIG. 5 and a total (=15×S1') of areas of the fifteen opening sections 9c1 in FIG. 7.

$$12 \times S1 > 15 \times S1' \tag{2}$$

Note that, in FIG. 7, the opening sections 9c2 are arranged in three rows. However, the opening sections 9c2 are not limited to the three rows and can be arranged in two rows or can be arranged in four rows.

Figures 9, 10:
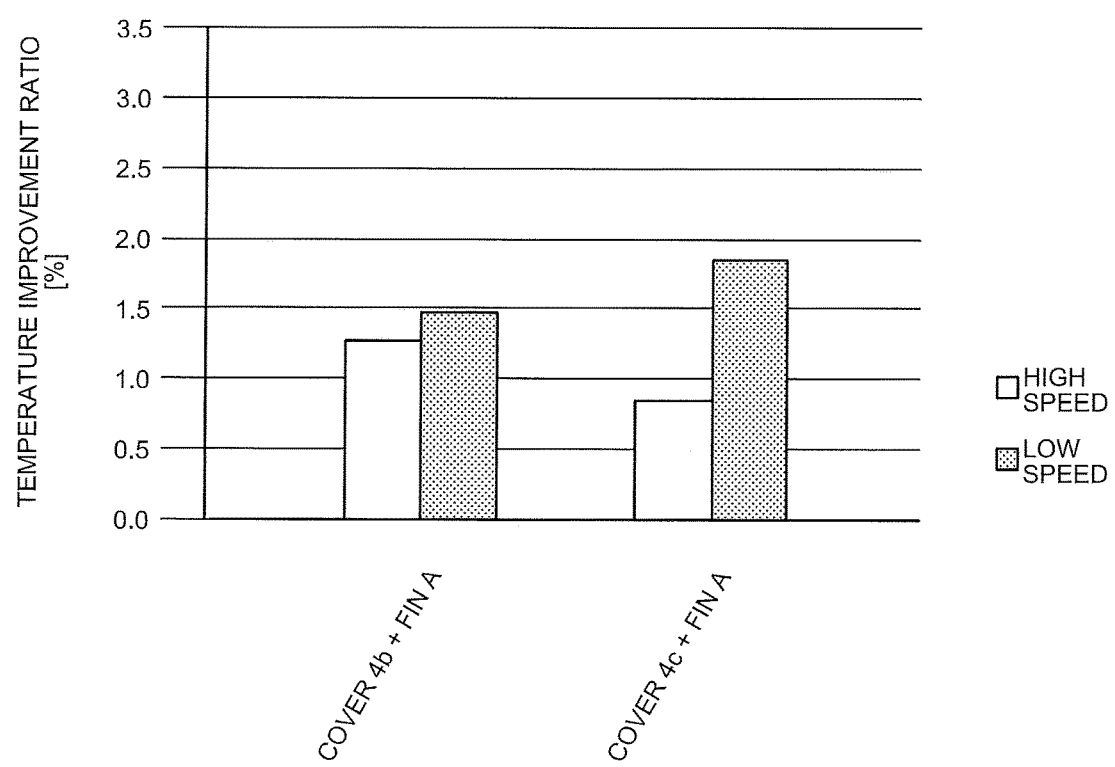
FIG. 9 is a table showing a temperature improvement ratio at the time when a cover 4a is set as a reference.
FIG. 10 is a graph showing the temperature improvement ratio at the time when the cover 4a is set as the reference.

A result of a simulation performed on the cover 4b and the cover 4c explained above is explained with reference to drawings of FIG. 9 and FIG. 10. FIG. 9 is a diagram showing, in a table format, a temperature improvement ratio at the time when the cover 4a is set as a reference. FIG. 10 is a diagram showing, as a graph, the temperature improvement ratio at the time when the cover 4a is set as the reference. The temperature improvement ratio is an evaluation index defined by the following expression.

$$\text{Temperature improvement ratio} = (Ta - T)/Ta \times 100 [\%] \tag{3}$$

Ta: temperature during attachment of the cover 4a, T: Temperature during attachment of various covers The following points are clarified by FIG. 9 and FIG. 10.

(1) Temperature is improved in both of the covers 4b and 4c compared with the reference cover 4a.

(2) In the cover 4c, an effect in a low-speed region is large compared with a high-speed region.

(3) In the cover 4b, a difference between effects in the high-speed region and the low-speed region is small.

(4) An improvement effect in the low-speed region is larger in the cover 4c than the cover 4b.

(5) An improvement effect in the high-speed region of the cover 4c is small compared with the cover 4b. This is considered to be because a total of areas of the opening sections 9c1 provided on the distal end portion side of the heat pipes 7 is smaller than a total of areas of the opening sections 9 corresponding to the opening sections 9c1 in FIG. 4 or FIG. 5.

Figure 11:
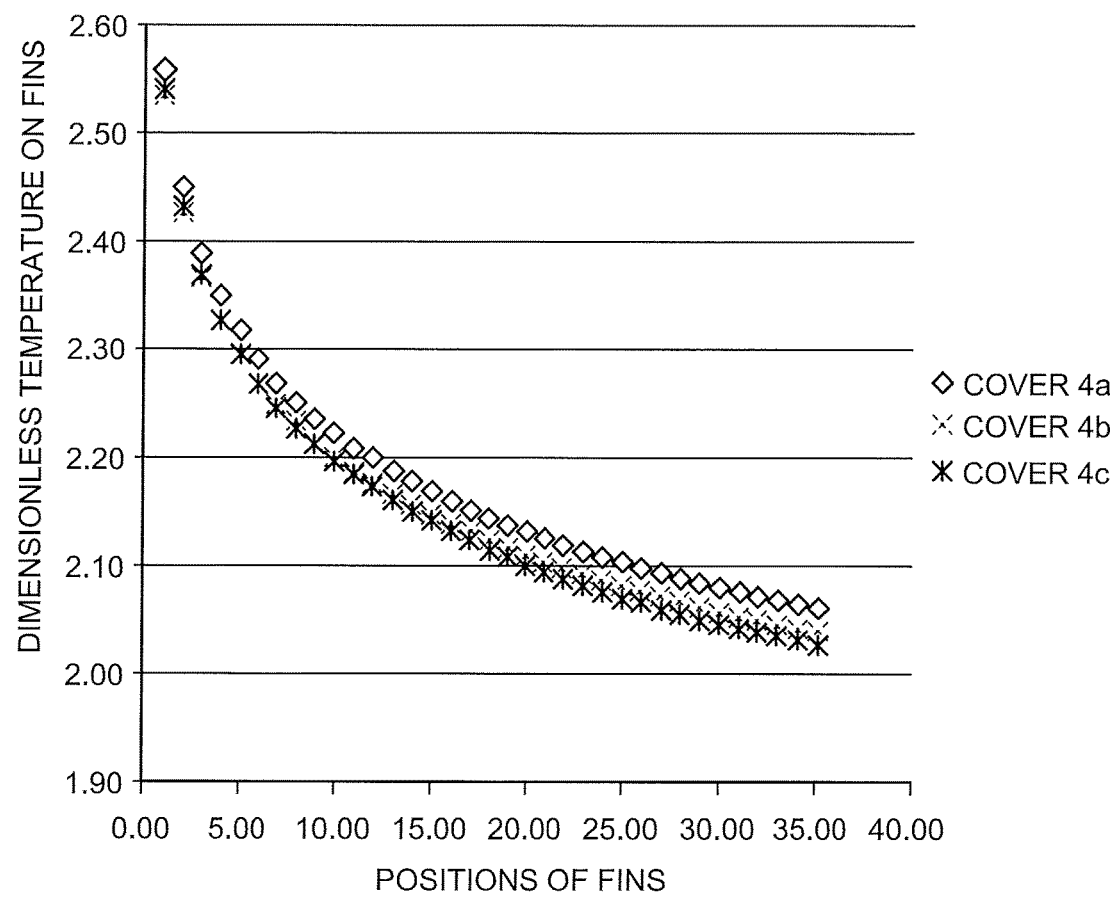
FIG. 11 is a graph showing a temperature distribution of fins corresponding to the positions of the fins in a low-speed region.
Figure 12:
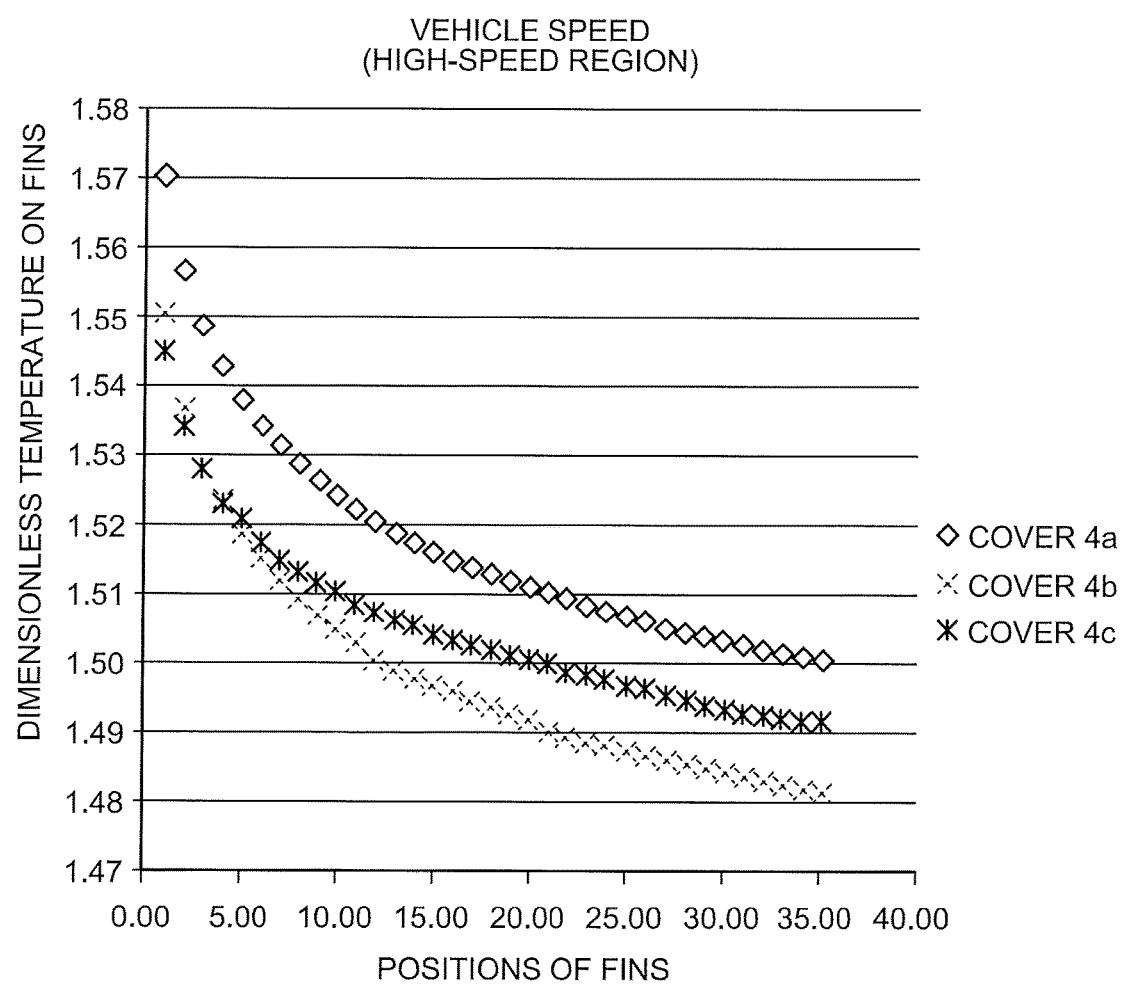
FIG. 12 is a graph showing a temperature distribution of the fins corresponding to the positions of the fins in a high-speed region.

FIG. 11 and FIG. 12 are a result of another simulation performed to support the simulation result shown in FIG. 9 and FIG. 10. In FIG. 11 and FIG. 12, temperature distributions of fins corresponding to the positions of the fins are shown. The positions of the fins are plotted on the horizontal axis. Dimensionless temperatures on the fins are plotted on the vertical axis. Note that, in the graphs, smaller numerical values representing the positions of the fins means the fins located further on the heat conduction plate 5 side.

As shown in FIG. 11 and FIG. 12, in both of the low-speed region and the high-speed region, temperature is higher in the fins located further on the heat conduction plate 5 side, in other words, the fins located further on a base side of the heat pipes 7, which is a connecting section between the heat conduction plate 5 and the heat pipes 7. Therefore, concerning the opening sections of the covers, by setting a total of areas of the openings located on the base side of the heat pipes 7 larger than a total of areas of the opening sections located on the distal end portion side of the heat pipes 7, cooling is promoted and improvement of cooling efficiency is enabled.

As explained above, with the cooling device according to the first embodiment, the openings of the protection covers are formed such that a total of opening areas of the opening sections of the protection covers is larger on a side closer to the heat conduction plate than on a side further away from the heat conduction plate. Therefore, there is an effect that it is possible to further improve the cooling efficiency.

Second Embodiment.

Figure 13:
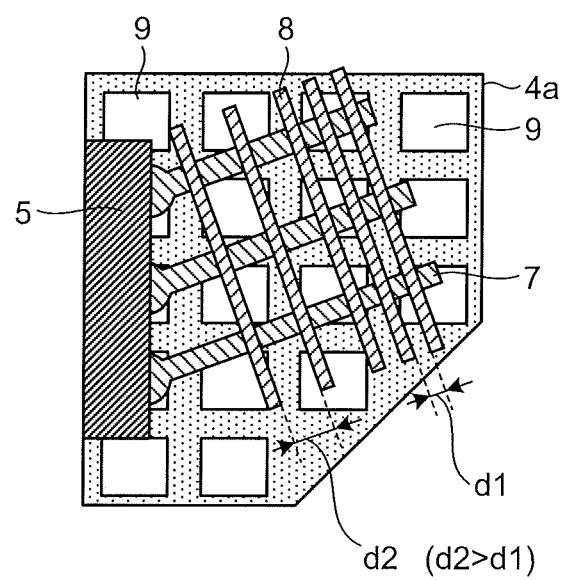
FIG. 13 is a perspective sectional view showing the configuration of a cooling member in a cooling device according to a second embodiment.

FIG. 13 is a perspective sectional view showing the configuration of a cooling member in a cooling device according to a second embodiment. In the first embodiment, the interval of the fins 8 is the equal interval. However, in the second embodiment, the interval of the fins 8 is not the equal interval. The fins 8 are configured such that a fin pitch d2 on the base side of the heat pipes 7 is wider than a fin pitch d1 on the distal end portion side of the heat pipes 7.

Figure 14:
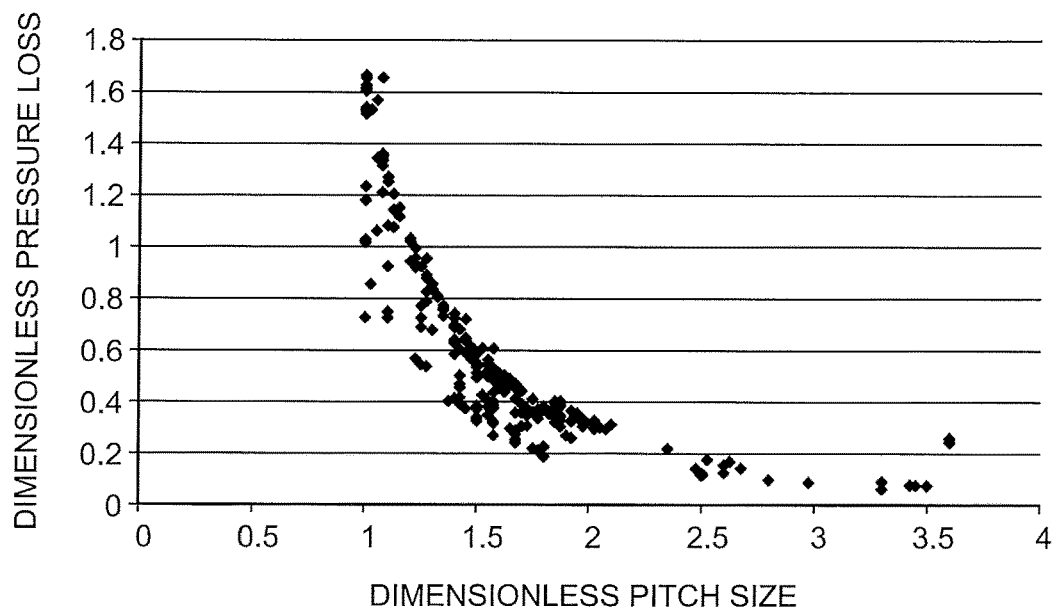
FIG. 14 is a graph in which a relation between a pitch size and a pressure loss is calculated by a simulation.

FIG. 14 is a graph in which a relation between a pitch size and a pressure loss is calculated by a simulation. A dimensionless pitch size obtained by normalizing the pitch size with a reference pitch is plotted on the horizontal axis. A dimensionless pressure loss obtained by normalizing the pressure loss with a reference pressure loss is plotted on the vertical axis. A simulation result shown in FIG. 14 indicates that it is possible to reduce the pressure loss if the pitch size is increased. The simulation result shown in FIG. 11 and FIG. 12 indicates that the temperature is higher in the fins located further on the heat conduction plate 5 side.

In the configuration in the second embodiment, the fins 8 are configured such that the fin pitch on the side closer to the heat conduction plate 5 is wider than the fin pitch on the side further away from the heat conduction plate 5. Therefore, more cooling air can be taken in by the fin pitch on the side closer to the heat conduction plate 5, which tends to have higher temperature. Consequently, it is possible to equalize a temperature distribution in the cooling device 1. It is possible to efficiently cool heat generating bodies.

In the configuration in the second embodiment, the interval of the fin pitch on the side away from the heat conduction plate 5, that is, the fin pitch located on the distal end portion side of the heat pipes 7 is maintained narrow without being widened. Therefore, it is possible to suppress a cooling effect from being reduced by a decrease in the number of fins. Note that, in FIG. 13, the fin pitch on the side close to the heat conduction plate 5 is widened and the fin pitch on the side away from the heat conduction plate 5 is maintained. However, the fin pitch on the side away from the heat conduction plate 5 can be narrowed according to the widening of the fin pitch on the side close to the heat conduction plate 5.

Third Embodiment.

Figure 15:
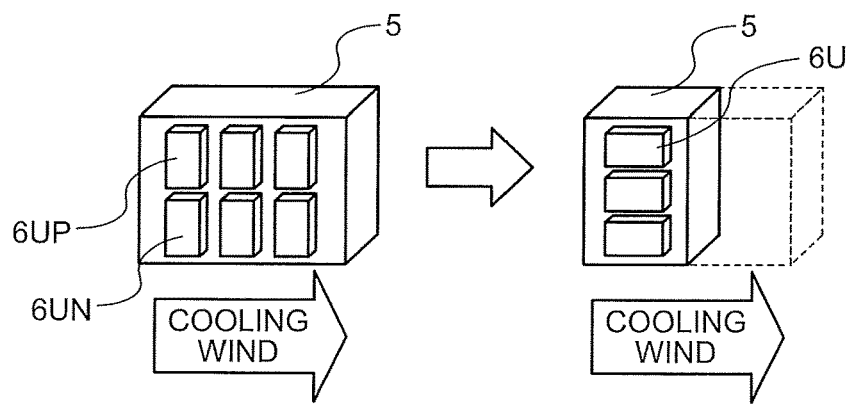
FIG. 15 is a diagram for explaining a concept of cooling efficiency improvement by SiC modularization.

In a third embodiment, semiconductor modules, which are cooling targets of the cooling device 1, and the arrangement of the semiconductor modules are explained with reference to FIG. 15. FIG. 15 is a diagram for explaining a concept of cooling efficiency improvement by SiC modularization.

Silicon (hereinafter described as "Si") modules having a high withstanding voltage and a large current for a railroad vehicle are modules, in one module of which one switching element and one diode are mounted, (hereinafter referred to as "1-in-1 modules"). Therefore, to configure two levels of main circuits, six 1-in-1 modules are necessary. Therefore, as arrangement on the heat conduction plate 5, for example, in a U phase, as shown in a figure on the left side of FIG. 15, 1-in-1 modules 6UP of an upper arm and 1-in-1 modules 6UN of a lower arm are arrayed in a direction orthogonal to cooling wind. As a result, there is a problem in that a difference in cooling performance is large between modules on a windward side and modules on a leeward side and the volume of the cooling device and the cost of the cooling device increase to secure cooling performance according to the modules on the leeward side.

On the other hand, if a switching element formed by silicon carbide (hereinafter described as "SiC"), which attracts attention in these years, is used for a power converter instead of the Si, it is possible to reduce the size of modules. SiC modules for a high withstanding voltage and a large current have already been developed. However, the SiC modules are modules, in one module of which two switching elements and two diodes are mounted, (hereinafter referred to as "2-in-1 modules"). Therefore, for example, in the U phase, upper and lower arms of the U phase can be configured by one 2-in-1 module. As a result, as shown in a figure on the right side of FIG. 15, the volume of the heat conduction plate 5 can be reduced to approximately a half. It is possible to arrange all of three 2-in-1 modules 6U configuring two levels of main circuits in a direction orthogonal to cooling wind. With this configuration, it is possible to use the cooling device at high efficiency. It is possible to reduce the size of the cooling device.

Further, if the technologies explained in the first and second embodiments are used together, it is possible to further improve the cooling efficiency. It is possible to contribute to a reduction in the cost and a reduction in the size of the cooling device.

Note that the SiC is an example of a semiconductor called wide band gap semiconductor in view of a characteristic that a band gap is larger in the SiC than in the Si. Besides the Sic, for example, semiconductors formed using a gallium nitride (GaN) material or diamond (C) also belong to the wide band gap semiconductor. Characteristics of the semiconductors are similar to the characteristics of the SiC in many points. Therefore, configurations in which wide band gap semiconductors other than the SiC are used also form the gist of this application.

The configurations explained in the embodiments indicate examples of the contents of the present invention.

The configurations can be combined with other publicly-known techniques. A part of the configurations can be omitted or changed in a range not departing from the spirit of the present invention.

REFERENCE SIGNS LIST 1 cooling device
1a housing
2 storage box
3 suspension member
4a cover (reference cover)
4b, 4c cover
5 heat conduction plate
6 semiconductor module
6UP, 6UN 1-in-1 module
6U 2-in-1 module
7 heat pipe
8 fin
9, 9b, 9c1, 9c1 opening section
10a, 10b traveling direction

The invention claimed is:

1. A cooling device for a railroad vehicle that cools a heat generating body housed in a storage box set on a floor of the railroad vehicle, the cooling device comprising:
   a heat conduction plate configuring a part of a side surface of the storage box, the heat generating body being mounted on one surface side of the heat conduction plate;
   a plurality of heat pipes inclined to project from the other surface side to an upper side of the heat conduction plate;
   a plurality of fins fixed to the plurality of heat pipes; and
   a protection cover including opening sections and a cover for the cooling device, a total of areas of the opening sections located on a base side of the heat pipes being formed larger than a total of areas of the opening sections located on a distal end portion side of the heat pipes, wherein
   one of the opening sections located on the base side of the heat pipes is formed to have an area smaller than an area of one of the opening sections located on the distal end portion side of the heat pipes.

2. The cooling device for the railroad vehicle according to claim 1, wherein the opening sections are arranged along a direction in which the heat pipes extend.

3. The cooling device for the railroad vehicle according to claim 1, wherein an interval between the fins adjacent to each other is larger between the fins located on the base side of the heat pipes than between the fins located on the distal end portion side of the heat pipes.

4. The cooling device for the railroad vehicle according to claim 1, wherein
   the heat generating body is a 2-in-1 module in which two switching elements and two diodes formed of wide band gap semiconductors are mounted, and
   three sets of the 2-in-1 modules are arranged in a direction orthogonal to cooling wind.

5. The cooling device for the railroad vehicle according to claim 4, wherein the wide band gap semiconductor is a semiconductor in which silicon carbide, a gallium nitride material, or diamond is used.

6. The cooling device for the railroad vehicle according to claim 1, wherein the opening sections located on the base side of the heat pipes are opening sections for cooling a side surface of the heat conduction plate.

7. A cooling device for a railroad vehicle that cools a heat generating body housed in a storage box set on a floor of the railroad vehicle, the cooling device comprising:
   a heat conduction plate configuring a part of a side surface of the storage box, the heat generating body being mounted on one surface side of the heat conduction plate;
   a plurality of heat pipes inclined to project from the other surface side to an upper side of the heat conduction plate;
   a plurality of fins fixed to the plurality of heat pipes; and
   a protection cover including opening sections and a cover for the cooling device, a total of areas of the opening sections located on a base side of the heat pipes being formed larger than a total of areas of the opening sections located on a distal end portion side of the heat pipes, wherein the opening sections are arranged in rows parallel to a direction in which the heat pipes extend in a longitudinal direction.

8. A cooling device for a railroad vehicle that cools a heat generating body housed in a storage box set on a floor of the railroad vehicle, the cooling device comprising:
   a heat conduction plate configuring a part of a side surface of the storage box, the heat generating body being mounted on one surface side of the heat conduction plate;
   a plurality of heat pipes inclined to project from the other surface side to an upper side of the heat conduction plate;
   a plurality of fins fixed to the plurality of heat pipes; and
   a protection cover including opening sections and a cover for the cooling device, a total of areas of the opening sections located on a base side of the heat pipes being formed larger than a total of areas of the opening sections located on a distal end portion side of the heat pipes, wherein an interval between the fins adjacent to each other is larger between the fins located on the base side of the heat pipes than between the fins located on the distal end portion side of the heat pipes.

* * * * *